United States Patent [19]
Jassowski

[11] Patent Number: 5,641,978
[45] Date of Patent: Jun. 24, 1997

[54] INPUT/OUTPUT BUFFER LAYOUT HAVING OVERLAPPING BUFFERS FOR REDUCING DIE AREA OF PAD-LIMITED INTEGRATED CIRCUIT

[75] Inventor: Michael A. Jassowski, Shingle Springs, Calif.

[73] Assignee: Intel Corporation, Santa Clara, Calif.

[21] Appl. No.: 499,225

[22] Filed: Jul. 7, 1995

[51] Int. Cl.[6] .................................................. H01C 27/10
[52] U.S. Cl. .............................................. 257/203; 257/208
[58] Field of Search ...................................... 257/203, 208

[56] References Cited

FOREIGN PATENT DOCUMENTS

| | | | |
|---|---|---|---|
| 563973 | 10/1993 | European Pat. Off. | ............... 257/203 |
| 4-56355 | 2/1992 | Japan | ..................... 257/203 |
| 5-48054 | 2/1993 | Japan | ..................... 257/203 |
| 6-21331 | 1/1994 | Japan | ..................... 257/203 |

*Primary Examiner*—Mahshid D. Saadat
*Assistant Examiner*—T. M. Arroyo
*Attorney, Agent, or Firm*—Blakely, Sokoloff, Taylor & Zafman

[57] ABSTRACT

The I/O buffer layout of a pad-limited die comprises a pad ring having four partially-overlapping I/O-buffer arrays arranged in a pinwheel pattern at the periphery of a square die. To enable electrical interconnection of transversely-overlapping I/O buffers with the core logic of the die, overlapping I/O buffers of adjacent I/O-buffer arrays are separated by routing channels and the circuitry of longitudinally-overlapping buffers is abridged so that each of these buffers is capable of performing only a limited range of functions.

34 Claims, 4 Drawing Sheets

5,641,978

INPUT/OUTPUT BUFFER LAYOUT HAVING OVERLAPPING BUFFERS FOR REDUCING DIE AREA OF PAD-LIMITED INTEGRATED CIRCUIT

BACKGROUND OF THE INVENTION

1. Field of the Invention

The present invention relates to the field of integrated circuits, particularly to input/output buffer circuits.

2. Description of Related Art

The development of integrated circuits (ICs) has allowed the electronics industry to establish a trend with products that continue growing increasingly more powerful, reliable, functional, user-friendly, and inexpensive. ICs are widely utilized in a variety of electronic devices, e.g., personal computers, VCRs, wireless phones, pagers, watches, etc., as well as in a host of industrial applications such as heating, air-conditioning, and even automotive control, making these systems more reliable and efficient.

As shown in FIG. 1, an IC package 100 (e.g., a microprocessor) includes a die 102 attached to a metal lead frame 104, which is formed by a framework of lead fingers 106. Die 102 comprises a chip of semiconductor material having an array of active and/or passive microscopic logic elements (not shown) interconnected to form a functioning circuit. Bond wires 108 provide electrical interconnections between input/output (I/O) pads 110, located at the periphery of die 102, and lead fingers 106. Die 102 and lead frame 104 are encased in a ceramic or plastic encapsulant 112 for protection against environmental hazards. Generally, IC package 100 is electrically interconnected with various components located on a printed circuit (PC) board (not shown).

IC chips, such as die 102, are manufactured by simultaneously fabricating a plurality of identical circuits on a thin slice or a flat disk of semiconductor material called a wafer and subsequently separating the wafer into individual chips. Due to the current trend toward miniaturization of electronic components and also to cut manufacturing costs by increasing the number of chips available from a single wafer, it is desirable to make each individual die as small as possible.

FIG. 2 is a schematic view of an IC chip having a conventional I/O-buffer layout. The IC chip or die 102 has a core 114 and a pad ring, located at the periphery of the chip and comprising four adjacent but non-contiguous I/O buffer arrays 116. Each I/O buffer array includes a plurality of I/O pads 110 and a plurality of corresponding I/O buffer circuits 118, electrically coupled to a core logic 120. I/O buffer circuits 118 are linked by a plurality of power rails 121 comprising copper, aluminum, or gold wire traces. The function of power rails 121 is to support the high current-driving capabilities of I/O buffer circuits 118.

A conventional tri-state I/O buffer contains electrostatic discharge (ESD) circuitry activated when core logic 120 uses the corresponding I/O pad for receiving input signals from circuits external to die 102, an output-driver circuitry activated when core logic 120 uses the I/O pad for sending output signals to such external circuits, and circuitry to switch the I/O buffer between input and output modes. The main function of ESD circuitry is to protect core logic 120 from static electricity, since a large static voltage may be inadvertently delivered by people or equipment to a lead (or a pin) of the IC package. The output-driver circuitry is necessary since core logic 120 needs to drive relatively high currents into a PC board having logic elements and wiring with a high capacitance.

Due to the complexity of an I/O buffer circuit, the area it occupies on a die is relatively large. Furthermore, when the design of a die is "pad-limited" (i.e., the size of a chip is determined by the number of I/O pads that are required rather than by the size of the core logic), the pitch (width) of each individual I/O buffer is diminished to approximate the width of an I/O pad. Consequently, I/O buffers must be proportionally elongated to accommodate all the required I/O circuitry, making the pad ring wider and resulting in large unused corner areas 122–128, as shown in FIG. 2. Thus, the conventional layout of I/O buffers in the pad ring uses die area inefficiently, thereby increasing manufacturing costs.

SUMMARY OF THE INVENTION

It is accordingly desirable to provide an I/O-buffer layout that reduces the die area of a pad-limited IC chip.

It is also desirable to provide an I/O-buffer layout that allows the die to bond into square lead frames, decreases layout complexity, and makes it possible to route the power rails that link the I/O buffers around the corners of the die in an efficient manner.

Further advantages of the invention will become apparent after consideration of the ensuing description and the accompanying drawings.

In one embodiment of the invention, the I/O buffer layout of a pad-limited die comprises a pad ring having four partially-overlapping I/O-buffer arrays arranged in a pinwheel pattern at the periphery of a square die. To enable electrical interconnection of transversely-overlapping I/O buffers with the core logic of the die, overlapping I/O buffers of adjacent I/O-buffer arrays are separated by routing channels and the circuitry of longitudinally-overlapping buffers is abridged so that each of these buffers is capable of performing only a limited range of functions.

BRIEF DESCRIPTION OF THE DRAWINGS

The present invention is illustrated by way of example, and not by way of limitation, in the figures of the accompanying drawings, where.

For purposes of illustration, these figures are not necessarily drawn to scale. In all of the figures, like components are designated by like reference numerals.

DETAILED DESCRIPTION OF THE INVENTION

Throughout the following description, specific details are set forth in order to provide a more thorough understanding of the invention. However, the invention may be practiced without these particulars. In other instances, well known elements have not been shown or described to avoid unnecessarily obscuring the present invention. Accordingly, the specification and drawings are to be regarded in an illustrative, rather than a restrictive, sense.

Figure 1:
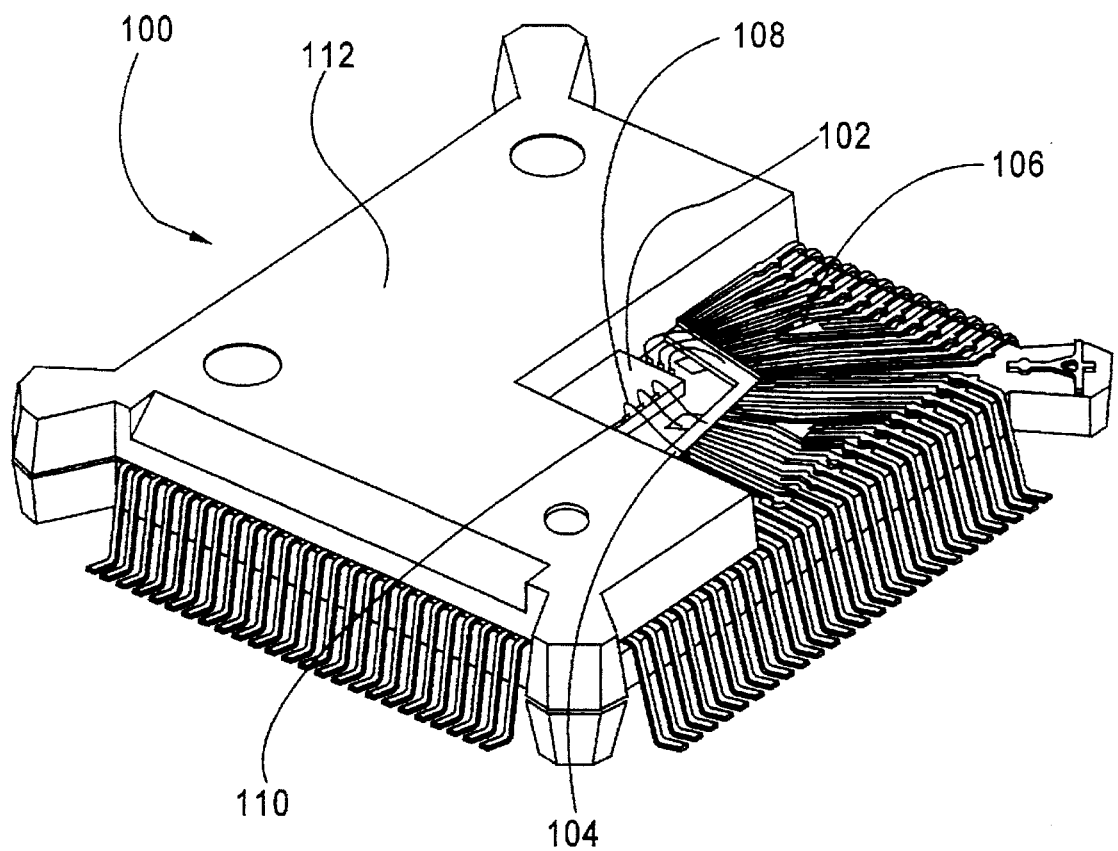
FIG. 1 is a perspective view of a conventional integrated circuit package.
Figure 2:
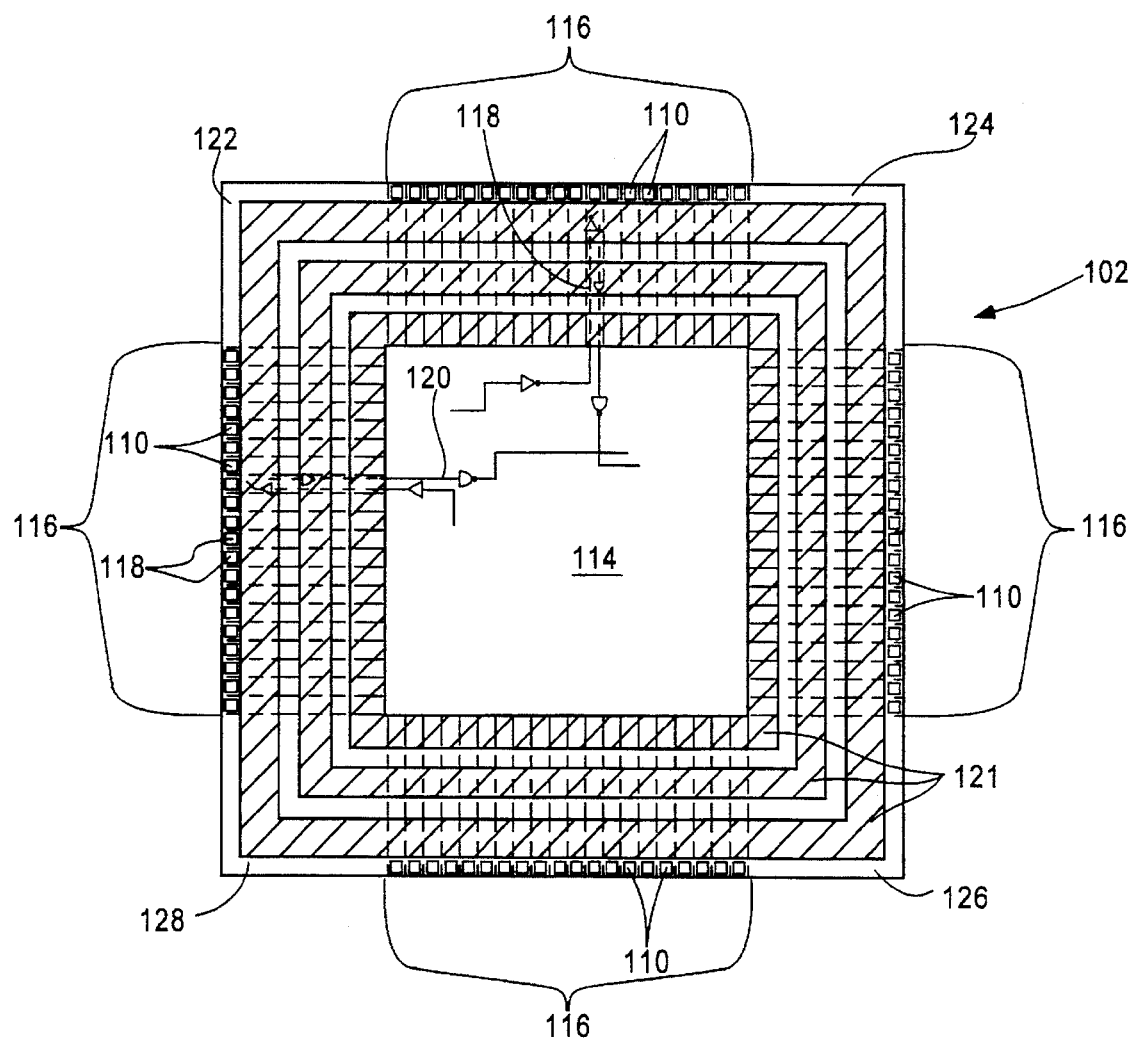
FIG. 2 is a schematic view of a prior-art I/O buffer layout.
Figure 3:
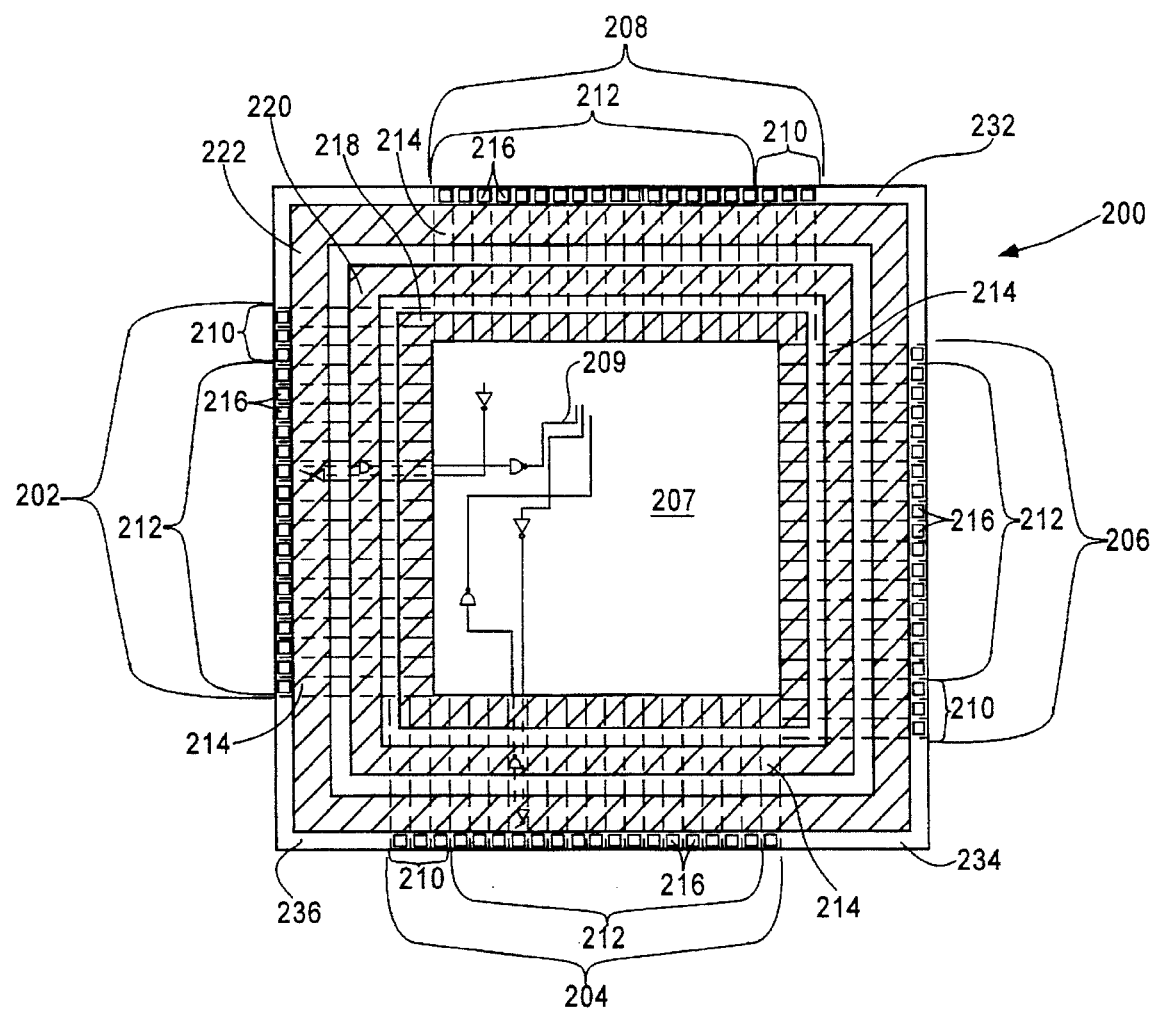
FIG. 3 is a schematic view of an I/O buffer layout according to the present invention.

FIG. 3 is a schematic view of an I/O buffer layout according to the present invention. The layout, implemented on a pad-limited square die 200, comprises a pad ring having four partially-overlapping rectangular I/O buffer arrays 202, 204, 206, and 208 that are arranged in a pinwheel pattern at the periphery of die 200. Arrays 202, 204, 206, and 208 surround chip core 207, which contains core logic 209. Each I/O buffer array, e.g., array 202, includes a plurality of buffers 210, transversely overlapping an adjacent I/O buffer array, e.g., array 208, a plurality of non-overlapping buffers 212, a buffer 214, longitudinally overlapping another adjacent I/O buffer array, e.g., array 204, and a plurality of pads 216 located at the periphery of die 200.

Individual buffer circuits of I/O-buffer arrays 202, 204, 206, and 208 are electrically interconnected by a plurality of power rails 218, 220, and 222. In various IC designs, the number of power rails may vary and it is common to have as many as six or eight power rails interconnecting individual I/O buffers. To route each power rail around the corners of die 200 such that it can electrically link the four I/O-buffer arrays, the number of transversely-overlapping buffers 210 in each I/O-buffer array must be limited to allow power rail 218 (the innermost power rail closest to core 207) to interconnect all the individual buffers of any one I/O buffer array, e.g., array 202, without abutting the perpendicular segment of a neighboring power rail, i.e., power rail 220, that interconnects the buffers of an adjacent I/O buffer array, e.g., array 208. The layout shown in FIG. 3 illustrates the limiting case of the amount of permissible buffer overlap for a pad ring having three rails. In this case, if an additional transversely-overlapping buffer 210 were added, the innermost power rail 218 would abut the neighboring power rail 220 and therefore could not be routed around the corner of the die.

Figure 4:
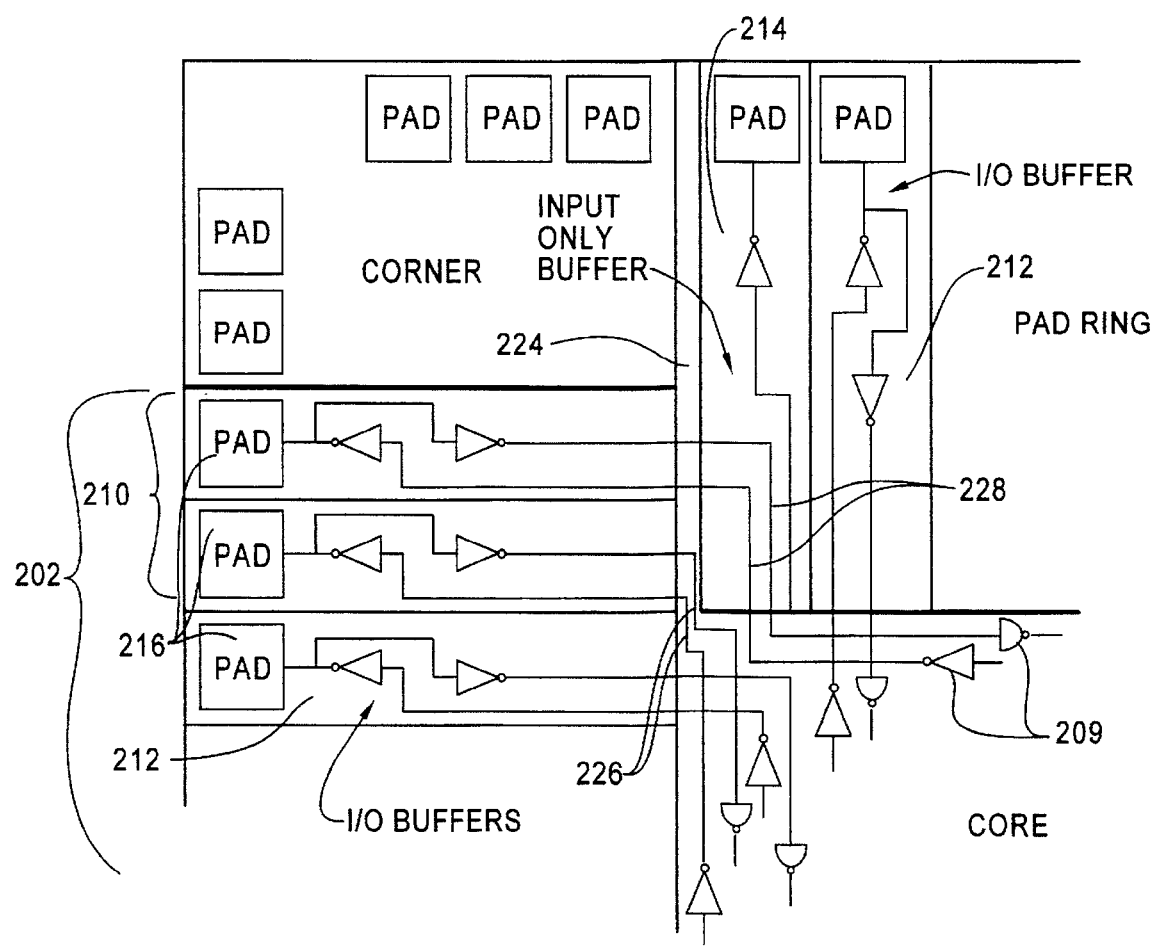
FIG. 4 is a schematic view of a detail of FIG. 3.

FIG. 4 schematically illustrates the interconnection of buffers 210 with core logic 209. To supply the necessary electrical interconnection of transversely-overlapping I/O buffers 210 with core logic 209, adjacent I/O buffer arrays, e.g., arrays 202 and 208, are separated by a routing channel 224 which accommodates electrical wiring, i.e., wire traces 226 that couple one or more buffers 210 with core logic 209. Additional space for routing wire traces, e.g., traces 228, may be provided by abridging the circuitry of longitudinally-overlapping buffers 214. For example, only input-buffer circuitry may be retained, allowing buffers 214 to perform a limited range of functions, such as electrostatic-discharge protection, connecting pad 216 to power rails, or input only.

As shown in FIG. 3, I/O buffer arrays 202, 204, 206, and 208 have identical dimensions, which in combination with their pinwheel arrangement, permits die 200 to retain its square configuration. This is beneficial since standard package footprints are square and a rectangular die bonded into a square lead frame would require longer bond-wire leads on two sides of the die, making the package more expensive to manufacture and more prone to malfunction since longer bond-wire leads tend to sway and short together. Additionally, since I/O buffers 210 are located closer to the corner of the die then I/O buffers in conventional pad-ring layouts, the length of bond-wire leads linking pads 216 of I/O buffers 210 with the corresponding lead fingers of the lead frame is reduced, increasing reliability and cutting cost. Furthermore, the identical dimensions of buffer arrays and their layout geometry allow for identical die corners 230, 232, 234, and 236, which also occupy a smaller area than the corners of a pad-limited die having a conventional I/O-buffer layout. Since die corners 230, 232, 234, and 236 are identical, layout complexity of components placed in those corners is greatly decreased because the same layout may essentially be repeated for each of the corners. Additionally, the dimensions of die 200 are reduced in length relative to a die having a conventional I/O-buffer layout by an amount equal to the I/O-buffer overlap.

Thus, an I/O buffer layout has been provided that reduces the area of a pad-limited IC chip, allows the die to bond into square lead frames, decreases layout complexity, and makes it possible to efficiently route the power rails that interconnect the I/O buffers around the corners of the die.

Many other modifications of the I/O-buffer layout, some of which are described herein, are possible. For instance, for interconnecting buffers 210 with core logic 209, it may not be necessary to simultaneously provide a routing channel 224 and abridge the circuitry of longitudinally-overlapping buffers 214. Instead, these two methods may be implemented in the alternative, i.e., routing channel 224 may be provided without abridging the circuitry of buffers 214 and vice versa. Furthermore, additional buffers 210 are possible in a layout that does not require electrical connections of inside power rail 218 around the corners of die 200.

The above configurations of the I/O buffer layout are given only as examples. Therefore, the scope of the invention should be determined not by the illustrations given, but by the appended claims and their equivalents.

What is claimed is:

1. A rectangular integrated-circuit chip comprising:
   a chip core containing core logic;
   a pad ring having a plurality of partially-overlapping input/output buffer arrays arranged in a pinwheel pattern around said chip core, each of said input/output buffer arrays containing a plurality of buffers each comprising an electronic circuit, said electronic circuit coupling said core logic to a pad located at the periphery of said chip; and
   a plurality of power rails coupling said plurality of buffers without abutting an adjacent power rail, each of said power rails having a straight section and a corner section, said corner section being located at a corner of said chip, said straight and corner sections of said power rails having substantially the same width.

2. The rectangular integrated-circuit chip of claim 1 wherein the partially-overlapping input/output buffer arrays are separated by routing channels.

3. The rectangular integrated-circuit chip of claim 1 wherein the electronic circuit of at least one said buffer of each said input/output buffer array is abridged.

4. The rectangular integrated-circuit chip of claim 3 further including routing channels between the partially-overlapping input/output buffer arrays.

5. An integrated-circuit die having a reduced area, comprising:
   a core containing a core logic and
   a pad ring including a plurality of input/output buffers forming a plurality of input/output buffer-circuit arrays arranged around said core in a pinwheel pattern, said input/output buffers being electrically coupled to said core logic, each of said input/output buffer-circuit arrays having a plurality of pads located at the periphery of said die, each of said input/output buffer-circuit arrays further comprising at least one first buffer transversely overlapping one said input/output buffer-circuit array adjacent to said at least one first buffer and at least one second buffer with an abridged circuitry, said at least one second buffer longitudinally overlapping another said input/output buffer-circuit array adjacent to said at least one second buffer.

6. The integrated-circuit die of claim 5 wherein said at least one first buffer is coupled to said core logic by electrical wiring.

7. The integrated-circuit die of claim 6 wherein said electrical wiring is routed through said at least one second buffer.

8. The integrated-circuit die of claim 6 wherein said electrical wiring is routed through a channel formed between said input/output buffer-circuit array adjacent to each other.

9. The integrated-circuit die of claim 8 wherein said electrical wiring is also routed through said at least one second buffer.

10. The integrated-circuit die of claim 5 wherein said integrated-circuit die has a square shape and said plurality of input/output buffer-circuit arrays is four.

11. The integrated-circuit die of claim 5 wherein said pad ring further includes a plurality of power rails routed around said core, each of said power rails electrically coupling each of said plurality of input/output buffers without abutting an adjacent power rail.

12. The integrated-circuit die of claim 5 wherein said abridged circuitry comprises electrostatic-discharge-protection circuitry.

13. The integrated-circuit die of claim 5 wherein said pad ring defines die corners having identical dimensions.

14. An integrated-circuit package comprising:
a rectangular die having a core containing a core logic and a pad ring including a plurality of partially overlapping input/output buffer arrays arranged around said core in a pinwheel pattern around said core, each of said input/output buffer arrays containing a plurality of buffers each comprising an electronic circuit, said electronic circuit coupling said core logic to an input/output pad located at the periphery of said die, each of said input/output buffer-circuit arrays having at least one first buffer transversely overlapping one said input/output buffer-circuit array adjacent to said at least one first buffer and at least one second buffer with an abridged circuitry, said at least one second buffer longitudinally overlapping another said input/output buffer-circuit array adjacent to said at least one second buffer, said pad ring further including a plurality of power rails coupling said plurality of buffers without abutting an adjacent power rail, each of said power rails having a straight section and a corner section, said corner section being located adjacent a corner of said chip, said straight and corner sections of said power rails having substantially the same width;
a square lead frame supporting said die, bond wires electrically coupling the input/output pads of said die to said square lead frame; and
an encapsulant encasing said die and said lead frame.

15. The integrated-circuit package of claim 14 wherein said die is pad limited.

16. The integrated-circuit package of claim 14 wherein said integrated-circuit die has a square shape and said plurality of input/output buffer-circuit arrays is four.

17. The integrated-circuit package of claim 14 wherein said pad ring defines die corners having identical dimensions.

18. An integrated-circuit chip comprising:
a chip core containing a core logic, said core logic comprising a plurality of logic elements that are interconnected to form a circuit;
a plurality of input/output pads disposed about the periphery of said chip;
a plurality of input/output buffers forming a first input/output buffer-circuit array and a second input/output buffer-circuit array, said input/output buffers disposed between said chip core and said input/output pads to electrically couple said core logic to said input/output pads, said first input/output buffer-circuit array having at least one first buffer transversely overlapping a second buffer of said second input/output buffer-circuit array, said second buffer longitudinally overlapping said at least one first buffer, said second buffer having a first space containing an abridged second buffer circuitry and a second space devoid of said second buffer circuitry; and
electrical wiring routed through said second space of said second buffer to electrically couple said at least one first buffer to said core logic.

19. The integrated-circuit chip of claim 18 further comprising a routing channel formed between said at least one first buffer and said second buffer.

20. The integrated-circuit chip of claim 19 wherein said electrical wiring is also routed through said routing channel to electrically couple said at least one first buffer to said core logic.

21. The integrated-circuit chip of claim 18 wherein said integrated-circuit chip has a rectangular shape.

22. The integrated-circuit chip of claim 21 further comprising a plurality of power rails coupling said first and second input/output buffer-circuit arrays, each of said power rails having a straight section and a corner section, said corner section being located adjacent a corner of said chip, said straight and corner sections of said power rails having substantially the same width.

23. The integrated-circuit chip of claim 20 wherein said integrated-circuit chip has a rectangular shape.

24. The integrated-circuit chip of claim 23 further comprising a plurality power rails coupled to said first and second input/output buffer-circuit arrays, each of said power rails having a straight section and a corner section, said straight and corner sections of said power rails having substantially the same width.

25. The integrated-circuit die of claim 18 wherein said abridged circuitry comprises electrostatic-discharge-protection circuitry.

26. An integrated-circuit chip comprising:
a chip core containing a core logic, said core logic comprising a plurality of logic elements that are interconnected to form a circuit;
a plurality of input/output pads disposed about the periphery of said chip;
a plurality of input/output buffers forming a first input/output buffer-circuit array and a second input/output buffer-circuit array, said input/output buffers disposed between said chip core and said input/output pads to electrically couple said core logic to said input/output pads, said first input/output buffer-circuit array having at least one first buffer transversely overlapping a second buffer of said second input/output buffer-circuit array, said second buffer longitudinally overlapping said at least one first buffer;
a channel formed between said at least one first buffer and said second buffer; and
electrical wiring routed through said channel and said second space of said second buffer to electrically couple said at least one first buffer to said core logic.

27. The integrated-circuit chip of claim 26 wherein said second buffer has a first space containing an abridged second buffer circuitry and a second space devoid of said second buffer circuitry.

28. The integrated-circuit chip of claim 27 wherein said electrical wiring is also routed through said second space of said second buffer to electrically couple said at least one first buffer to said core logic.

29. The integrated-circuit chip of claim 26 wherein said integrated-circuit chip has a rectangular shape.

30. The integrated-circuit chip of claim 29 further comprising a plurality of power rails coupling said first and second input/output buffer-circuit arrays, each of said power rails having a straight section and a corner section, said corner section being located adjacent a corner of said chip, said straight and corner sections of said power rails having substantially the same width.

31. The integrated-circuit chip of claim 28 wherein said integrated-circuit chip has a rectangular shape.

32. The integrated-circuit chip of claim 31 further comprising a plurality of power rails coupling said first and second input/output buffer-circuit arrays, each of said power rails having a straight section and a corner section, said corner section being located adjacent a corner of said chip, said straight and corner sections of said power rails having substantially the same width.

33. A rectangular integrated-circuit chip comprising:
   a chip core containing a core logic, said core logic comprising a plurality of logic elements that are interconnected to form a circuit;
   a plurality of input/output pads disposed about the periphery of said chip;
   a plurality of input/output buffers forming a first input/output buffer-circuit array and a second input/output buffer-circuit array, said input/output buffers disposed between said chip core and said input/output pads to electrically couple said core logic to said input/output pads, said first input/output buffer-circuit array having at least one first buffer transversely overlapping a second buffer of said second input/output buffer-circuit array, said second buffer longitudinally overlapping said at least one first buffer, said second buffer having a first space containing an abridged second buffer circuitry and a second space devoid of said second buffer circuitry;
   a plurality of power rails coupling said first and second input/output buffer-circuit arrays without abutting an adjacent power rail, each of said power rails having a straight section and a corner section, said corner section being located at a corner of said chip, said straight and corner sections of said power rails having substantially the same width;
   a channel formed between said at least one first buffer and said second buffer; and
   electrical wiring routed through said channel and second space of said second buffer to electrically couple said at least one first buffer to said core logic.

34. The integrated-circuit die of claim 11 wherein said each of said power rails contain at least one straight section and at least one corner section, said straight and corner sections having substantially the same width.

* * * * *